United States Patent [19]
Buynoski

[11] Patent Number: 5,756,381
[45] Date of Patent: May 26, 1998

[54] METHOD PROVIDING, AN ENRICHED SOURCE SIDE EXTENSION AND A LIGHTLY DOPED EXTENSION

[75] Inventor: Matthew Buynoski, Palo Alto, Calif.

[73] Assignee: Advanced Micro Devices, Inc., Sunnyvale, Calif.

[21] Appl. No.: 728,405

[22] Filed: Oct. 9, 1996

[51] Int. Cl.[6] ................................. H01L 21/8238
[52] U.S. Cl. .................... 438/199; 438/303; 438/305; 438/306; 257/336; 257/344; 257/408; 257/900
[58] Field of Search ................................. 438/199, 303, 438/305, 306, 168, 204, 216, 217, 218; 257/336, 344, 408, 900

[56] References Cited

U.S. PATENT DOCUMENTS

| | | | |
|---|---|---|---|
| 5,013,675 | 5/1991 | Shen et al. | 437/44 |
| 5,200,351 | 4/1993 | Hadjizadeh-Amini | 437/44 |
| 5,338,960 | 8/1994 | Beasom | 438/306 |

*Primary Examiner*—John Niebling
*Assistant Examiner*—Long Pham
*Attorney, Agent, or Firm*—Fliesler, Dubb, Meyer & Lovejoy LLP

[57] ABSTRACT

A semiconductor device having a lightly doped drain ("LDD") at a first dopant concentration and a source side extension ("SSE") at a second, higher, dopant concentration is provided. This allows for increased current saturation $I_{DSAT}$ due to a lower resistance at or near the source and thus increases semiconductor switching speed without hot carrier creation due to lighter doped, more graded body-drain junction. A method for manufacturing the semiconductor device, in particular a metal oxide semiconductor ("MOS") transistor, is also provided. A first photoresist mask is positioned over a portion of a polysilicon gate and a subsequently formed drain region of a transistor substrate. The transistor may be an N-channel or P-channel transistor. The SSE is formed using a higher dopant concentration than used in the LDD. A second photoresist mask is then used to cover the SSE region and portion of the polysilicon gate while a relatively lower implant dopant dose is used to form the LDD. Oxide spacers and heavy implant concentrations are then used to form a source and a drain.

14 Claims, 7 Drawing Sheets

METHOD PROVIDING, AN ENRICHED SOURCE SIDE EXTENSION AND A LIGHTLY DOPED EXTENSION

BACKGROUND OF THE INVENTION

1. Field of the Invention

The invention relates to semiconductor devices, and particularly, to manufacturing semiconductor devices, such as field effect transistors ("FET"s) having a lightly doped drain ("LDD").

2. Description of the Related Art

Semiconductor devices, such as complementary metal oxide semiconductors ("CMOS"), typically have regions known as lightly doped drains ("LDD"s). FIG. 1 illustrates a typical CMOS device 11 having a negative metal oxide semiconductor ("NMOS") transistor 30 and positive metal oxide semiconductor ("PMOS") transistor 31. Each transistor is formed on a substrate 12 and includes a gate 16 and 17, respectively. Gates 16 and 17 are insulated from channel 37 and 38 by insulating gate oxide layers 35 and 36, respectively. Spacers 22 and 23 are formed adjacent to gate 16 and spacers 33 and 34 are formed adjacent to gate 17. The NMOS and PMOS transistors 30 and 31 are electrically insulated by field oxide ("FOX") 15 and N-well/P-well junction 39. LDDs 25 and 26 are formed adjacent to the NMOS transistor's source 18 and drain 19, respectively. LDDs 27 and 28 are formed adjacent to PMOS transistor's source 20 and drain 21, respectively. Typically, LDDs are relatively lightly doped in comparison to an adjacent source/drain. For example, LDD 25 and LDD 26 have relatively lower doping concentrations than source 18 and drain 19 in NMOS transistor 30. For convenience, the LDDs adjacent to a source, such as LDDs 25 and 27, will be referred to as source side extensions ("SSEs"). LDDs are typically formed in order to lower the electric field near a body/drain depletion region so as to reduce hot carrier creation or injection which may cause subsequent semiconductor device degradation.

Hot carrier creation occurs when charged carriers moving through a transistor channel from source to drain collide with a nuclei in the transistor channel. The collision generates energetic electron-hole pairs that may then migrate and become trapped in an insulating layer (35 or 36) that separates the gate (16 or 17) from the channel (37 or 38) or at the surface of the gate insulating layer and the channel. As the charged particles build up, the electrical characteristics of the transistor are altered and leads to semiconductor device failure.

Typically, LDDs in an NMOS or PMOS transistor are formed using a single photoresist mask. For example, photoresist mask 24 covers PMOS transistor 31 while SSE 25 and LDD 26 are formed using an acceptor implant 12, as illustrated by the arrows. SSE 25 and LDD 26 are created before spacers 22/23 and source 18 and drain 19 are formed. The N-type LDD doping concentration used is typically between approximately $5 \times 10^{12}$ atoms/cm$^2$ and $3 \times 10^{13}$ atoms/cm$^2$ for typical 0.35–0.5 $\mu$ gate length transistors. The N-type heavier doping implant used to form source 18 and drain 19 is typically between approximately $1 \times 10^{15}$ and $3 \times 10^{15}$ atoms/cm$^2$.

Similarly, a photoresist mask may be positioned over NMOS transistor 30 in order to form SSE 27 and LDD 28, before the oxide spacers 33/34, source 20 and drain 21 are formed in PMOS transistor 31.

While using a single photoresist mask in simultaneously forming both SSE 25 and LDD 26 in NMOS transistor 30 reduces hot carrier creation, resistance at or near source 18 is increased. The formation of LDD 26 reduces hot carrier creation, but the relative increase in resistance at or near source 18 due to the formation of SSE 25 lowers the amount of current NMOS transistor 30 can provide based on a predetermined voltage. Thus, NMOS transistor 30 switching speed is limited. In other words, the forming of SSE 25 in CMOS semiconductor 11 reduces the current saturation $I_{DSAT}$ for NMOS transistor 30 by increasing resistance at or near source 18.

Furthermore, using a single photoresist mask in simultaneously forming both an SSE and LDD does not allow for the independent formation or decoupling of forming an SSE region and LDD region. Semiconductor device characteristics, in particular MOS transistor characteristics, may be improved by independently forming an SSE region and LDD region. An SSE region may require certain electrical characteristics which are not necessarily desirable for the LDD region.

Thus, it is desirable to provide a semiconductor device and manufacturing process which enables the independent formation of an SSE and LDD in a MOS transistor. It is further desirable to increase transistor current saturation $I_{DSAT}$ without increasing hot carrier creation, thereby increasing transistor switching speed.

SUMMARY OF THE INVENTION

The invention overcomes the above-mentioned problems by providing a semiconductor manufacturing process using multiple photoresist masks in forming an SSE and LDD region in a transistor.

According to an aspect of the present invention, a process for manufacturing a semiconductor device comprises the steps of: (a) forming a region in a substrate having first conductive type; (b) forming a gate on the first conductive type region; (c) forming a first mask over a first portion of the first conductive type; (d) implanting a lightly doped charge of a second conductive type into a second portion of the first conductive type region; (e) forming a second mask on the second portion; and; (f) implanting a lightly doped charge of a second conductive type into the first portion According to another aspect of the present invention, a method for manufacturing a complimentary metal oxide semiconductor ("CMOS") device having a positively charged P-well region and a negatively charged N-well region, comprises the steps of: (a) forming a first gate on the P-well region; (b) forming a second gate on the N-well region; (c) forming a mask on the N-well region and a first portion of the P-well region; (d) implanting a lightly doped donor species into a second portion of the P-well region; (e) forming a mask on the N-well region and the second portion of the P-well region; (f) implanting a different dose of donor species into the first portion of the P-well region; (g) forming a mask on the P-well region and a first portion of the N-well region; (h) implanting a light dose of acceptor species into a second portion of the N-well region; (i) forming a mask on the P-well region and the second portion of the N-well region; (j) implanting a different dose of acceptor species into the first portion of the N-well region; (k) forming respective oxide spacers adjacent the first and second gates; (l) forming a mask on the N-well region; (m) implanting a heavy dose of donor species into to the P-well region; (n) forming a mask on the P-well region; and, (o) implanting a heavy dose of acceptor species into to the N-well region.

According to another aspect of the present invention, a semiconductor device comprises: (a) a substrate having a P-well; (b) a first source in the P-well; (c) a first drain in the P-well; (d) a first lightly doped drain ("LDD") in the P-well having a first concentration; (e) a first source side extension ("SSE") in the P-well having a second concentration; (f) a first gate on the substrate; and, (g) a first and second spacers adjacent to the first gate.

Other aspects and advantages of the present invention can be seen upon review of the figures, the detailed description, and the claims which follow.

DETAILED DESCRIPTION OF THE INVENTION

FIGS. 2–7 show cross-sections of a substrate during various process steps in manufacturing a semiconductor device, in particular FETs used in forming a CMOS device; according to the present invention. It should be noted that not all process steps are shown in the figures, but only a general representation of the cross-section at key points in the process. One of ordinary skill in the art of manufacturing semiconductor devices would understand that this particular set of process steps has been offered for illustration and various modifications in concentrations and energy levels may be used depending upon the particular application intended or technology used. Further, the present invention applies to the fabrication of both enhancement mode and depletion mode semiconductor devices. Accordingly, the below description of particular dopant-type embodiments is used for convenience.

Figure 1:
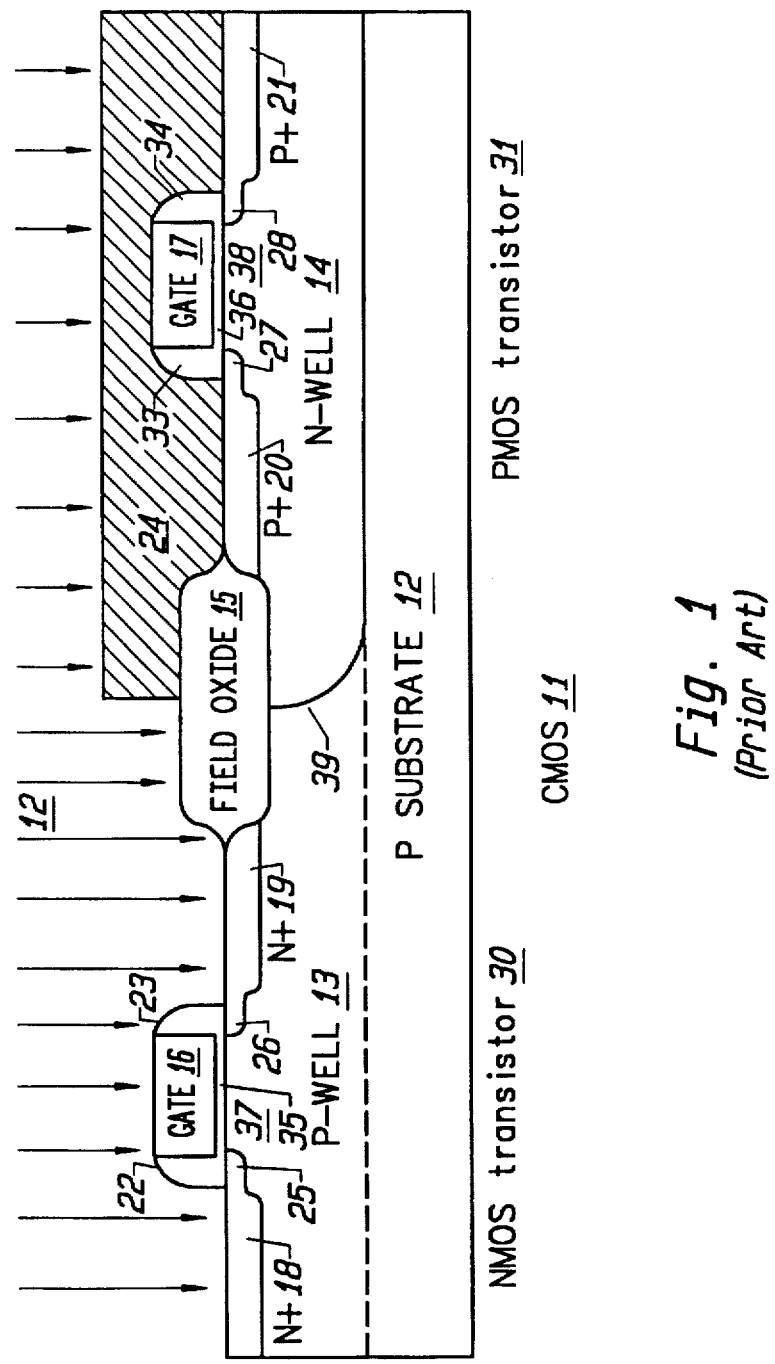
FIG. 1 is a cross-sectional side-view of a CMOS semiconductor device.
Figure 2:
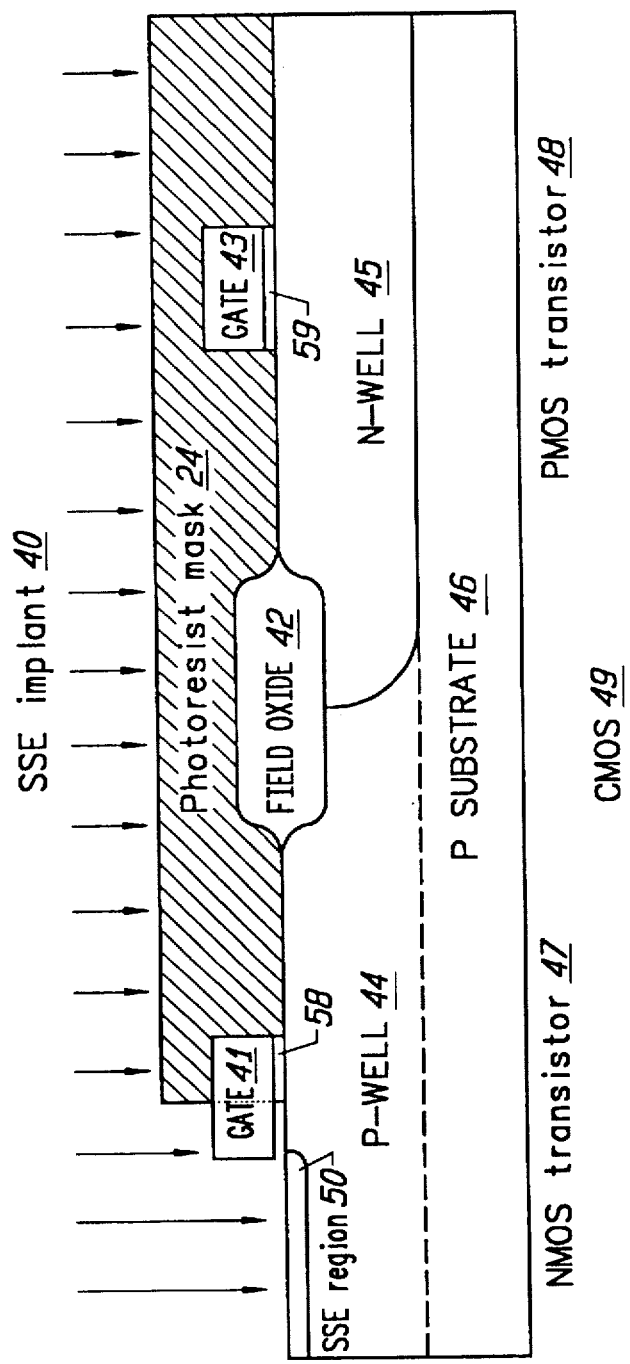
FIGS. 2–7 illustrate the semiconductor device processing steps utilized to form SSE and LDD regions on a substrate according to the present invention.

A substrate 46 with a background of P-type or acceptor species impurities is shown in FIG. 2. In an embodiment, substrate 46 may be a model crystalline silicon wafer having a predetermined concentration of Boron (B). Using conventional fabrication techniques as known by one of ordinary skill in the art of semiconductor processing, various structures are formed on substrate 46 to manufacture CMOS 49. For example, P-type substrate 46 is formed including a P-well 44 and an N-well 45 for NMOS transistor 47 and PMOS transistor 48, respectively. Field oxide 42 is formed to isolate NMOS transistor 47 from PMOS transistor 48. Gate oxide layers 58 and 59 are also formed, along with polysilicon gates 41 and 43.

A conventional photoresist process is then utilized to form mask 24. A photoresist layer is deposited and a masking step is performed to expose the photoresist layer and, depending on the type of photoresist (typically, a positive acting resist), the exposed or unexposed portions of the photoresist are removed. In particular, a photoresist mask 24 is formed over PMOS transistor 48 and a portion of P-well 44 and gate 41.

An N-type, or donor species, dopant is implanted to form source side extension ("SSE") region 50, as illustrated by arrows 40. In an embodiment, the N-type dopant is Arsenic (A). The implant dosage and implant energy is selected so that lightly doped region 50 has desired electrical characteristics. A relatively thick or shallow SSE region may be formed, depending upon the desired application. For example, the N-type dopant implant dose may be between approximately $1 \times 10^{14}$ atoms/cm$^2$ to $1 \times 10^{15}$ atoms/cm$^2$. The N-type doping concentration may be higher than the P-type doping concentration used in forming SSE region 65 and lightly doped drain ("LDD") region 75, as described below.

The P-type dopant, typically Boron, concentrations used in forming SSE region 65 and LDD region 75, may cause subsequent semiconductor reliability problems if used at higher concentrations. The Boron at high concentration levels may penetrate gate 43 and insulating layer 59, adversely altering electrical characteristics of PMOS transistor 48. The energy level used in implanting SSE region 50 may be between approximately 25 and 80 KeV, depending on the intended species used. The implant energy level selected should be relatively low compared to the energy level used in forming the LDD concentration region 55 so as to compensate for the higher doping concentration in forming SSE region 50 and reducing overlap capacitance between the SSE region 50 and gate 16. This overlap capacitance is known as "Miller Capacitance."

Figure 3:
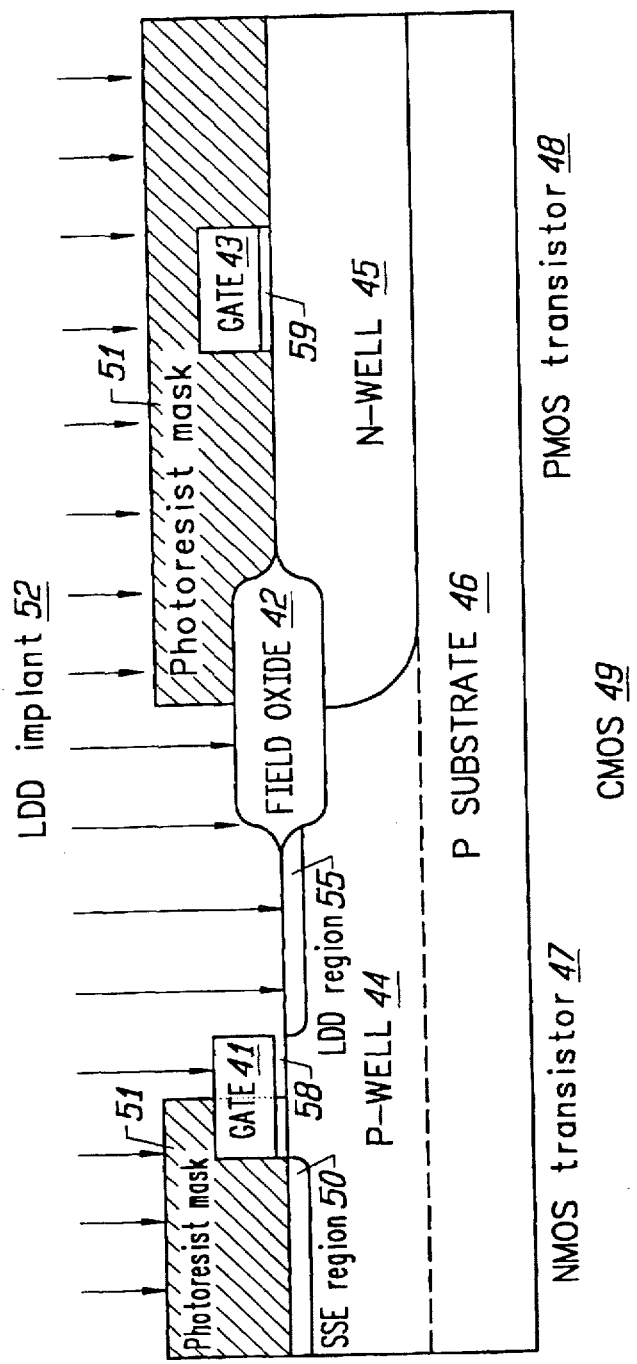

FIG. 3 illustrates forming LDD region 55. Mask 24, as illustrated in FIG. 2, is removed using conventional techniques known to one of ordinary skill in the semiconductor processing art. As in FIG. 2, a mask 51, for example a photoresist mask, is then formed over PMOS transistor 48 and the implanted SSE region 50 and gate 41. The N-type dopant used to form LDD region 55 is illustrated by LDD implant 52 arrows. In an embodiment, the N-type dopant is Phosphorous. The N=type dopant concentration used to form LDD region 55 is the same or less than the N-type dopant concentrations typically used in forming LDD region 55 when a single photoresist mask is used to form both the SSE and LDD regions. For example, the dopant concentration may be between approximately $1 \times 10^{13}$ atoms/cm$^2$ and $1 \times 10^{14}$ atoms/cm$^2$ for transistors having a gate length of between approximately 0.25–0.35 μ. Likewise, the energy level used in forming LDD region 55 may be the same or higher than is typically used in forming an LDD region 55 when a single photoresist mask is used to form both the SSE and LDD regions. For example, the energy level may be between approximately 25 KeV and 80 KeV. Using a higher implant energy in forming LDD region 55 offers a deeper and more graded junction and thus better hot carrier resistance. However, too high an implant energy creates more capacitance between subsequently formed drain 83 and gate 41 and/or possibly causes short-channel effects.

It should be understood that the process steps illustrated in FIGS. 2 and 3 to form SSE region 50 and LDD region 55, respectively, may be interchanged in a sequence of processing steps.

By using two masks in forming SSE region 50 and LDD region 55, additional degrees of freedom are provided to semiconductor device designers. Specifically, semiconductor device designers may use different implant dosages and energy levels in forming SSE region 50 than are used in forming LDD region 55. Thus, source and drain electrical characteristics may be optimized and formed independently.

Figure 6:
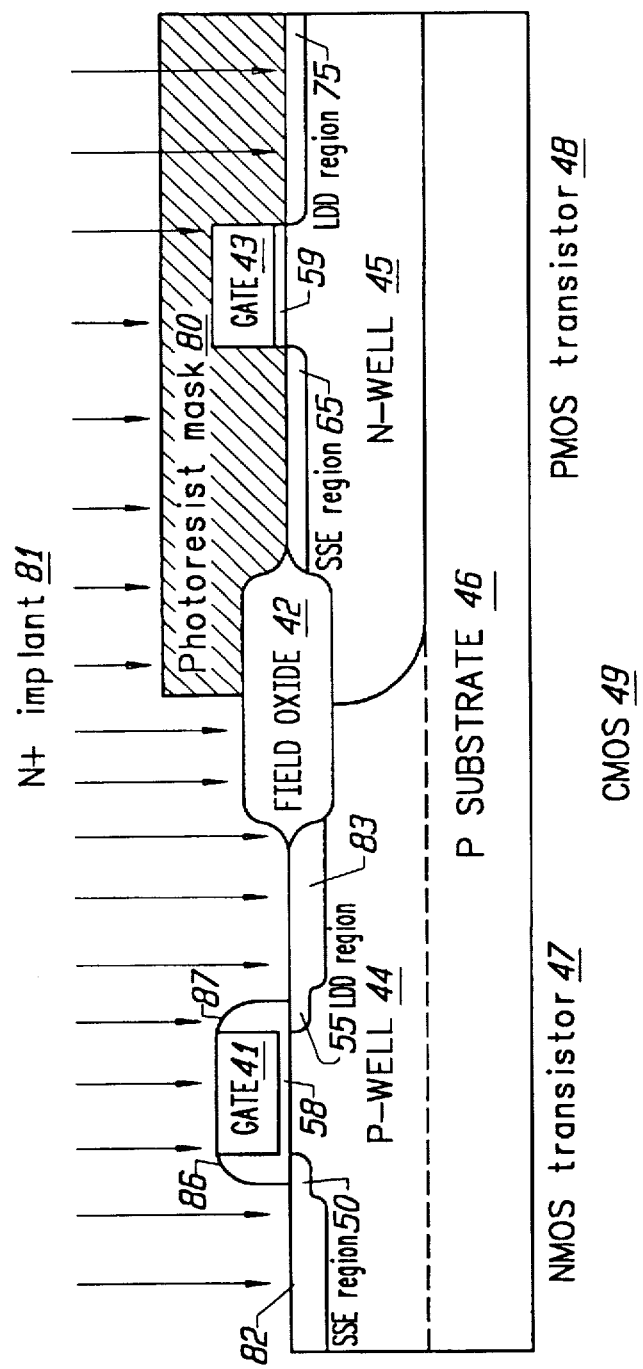

Rather than using two masks to form SSE region 50 and LDD region 55, one could remove oxide spacer 86, as illustrated in FIG. 6, before forming source 82. Consequently, the formation of source 82 would remove the need for SSE region 50. However, etching or removing spacer 86 would also cause gate 41, as well as other portions of the substrate, to be adversely removed or etched unless an additional mask was used to protect gate 41. This process would cause additional complexity and require a precise formation of a mask over gate 41. Present technologies may not be able to accurately position such a mask.

Figure 4:
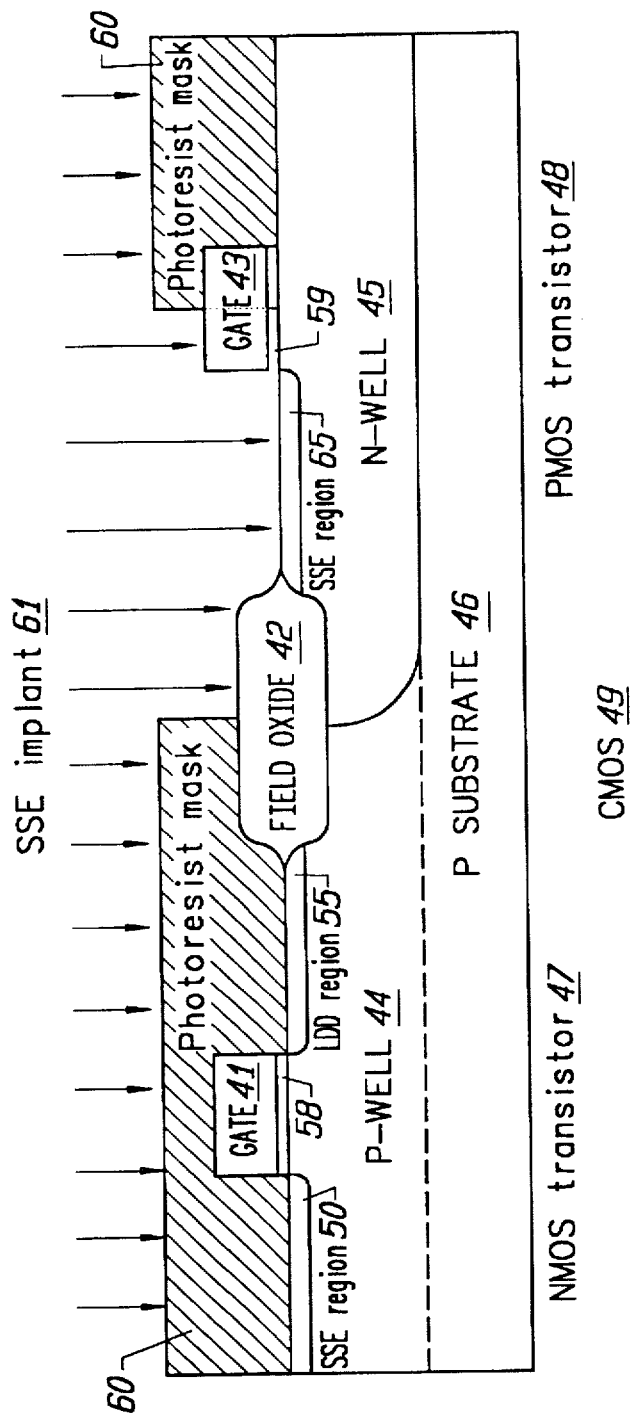

FIG. 4 illustrates forming SSE region 65 in PMOS transistor 48. As described above, mask 51, as illustrated in FIG. 3, is removed using conventional techniques. As illustrated in FIG. 2, a mask 60 is formed over NMOS transistor 47 and a portion of N-well 45 and gate 43 in order to subsequently form SSE region 65.

A P-type dopant is implanted, as illustrated by the arrows, to form SSE region 65. The implant dose and implant energy is selected so that SSE region 65 has predetermined desired electrical characteristics. A relatively thick or shallow SSE region 65 may be formed, depending upon the desired application. The P-type dopant used to implant SSE region 65 may be, for example, $B^+$ or $BF_2$, and the implant dosage concentration may be, for example, between approximately $1 \times 10^{14}$ atoms/cm$^2$ to $1 \times 10^{15}$ atoms/cm$^2$. The energy level used in implanting SSE region 65 may be between approximately 15–50 KeV.

Figure 5:
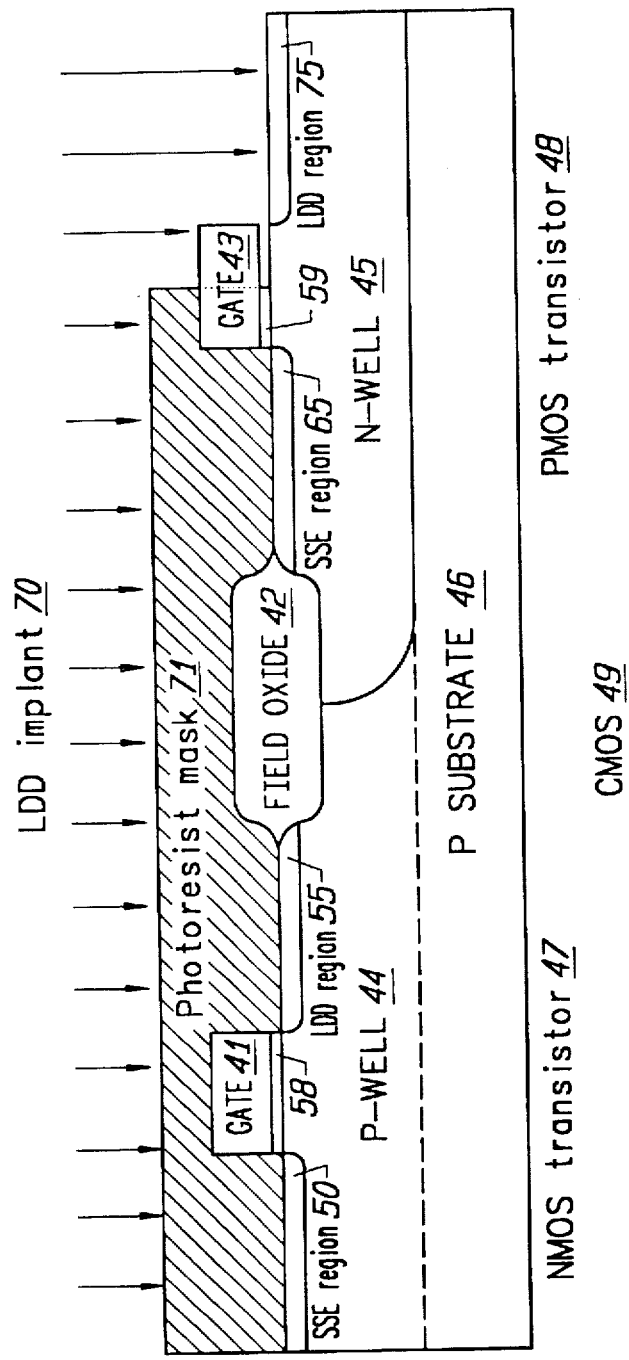

FIG. 5 illustrates the forming of LDD region 75. The mask 60, as illustrated in FIG. 4, is removed using conventional techniques. A mask 71, for example a photoresist mask, is positioned over NMOS transistor 47 and SSE region 65 and a portion of gate 43. A P-type dopant is implanted to form LDD region 75. The implant dose and implant energy is selected so that LDD region 75 has the desired predetermined electrical characteristics. The P-type dopant used to implant LDD region 75 may be, for example, $B^+$ or $BF_2$ and the implant dosage concentration may be between, for example, approximately $5 \times 10^{12}$ atoms/cm$^2$ to $5 \times 10^{13}$ atoms/cm$^2$. The energy level used in implanting LDD region 75 may be between approximately 35–80 KeV.

FIG. 6 illustrates the forming of spacers 86 and 87 using conventional techniques as known by one of ordinary skill in the semiconductor processing art. In an embodiment, the spacers may be oxide spacers. Photoresist mask 71, as illustrated in FIG. 5, is removed and photoresist mask 80 is formed using conventional techniques. Photoresist mask 80 is used to cover PMOS transistor 48 during a heavy N-type implant, as illustrated by the arrows. A heavy N-type dopant, such as Arsenic, is implanted to form drain 82 and source 83 of NMOS transistor 47. The implant may include a diffusion (or activation) of the implanted ions. Oxide spacers 86 and 87 allow for the heavy N-type dopant to form source 82 and drain 83 while masking SSE region 50 and LDD region 55 from the heavier N-type implant. In an embodiment, a heavy N-type implant can be formed using Arsenic in a concentration of approximately $2 \times 10^{15}$ atoms/cm$^2$ to $4 \times 10^{15}$ atoms/cm$^2$, at an implant energy of approximately 50 keV.

Figure 7:
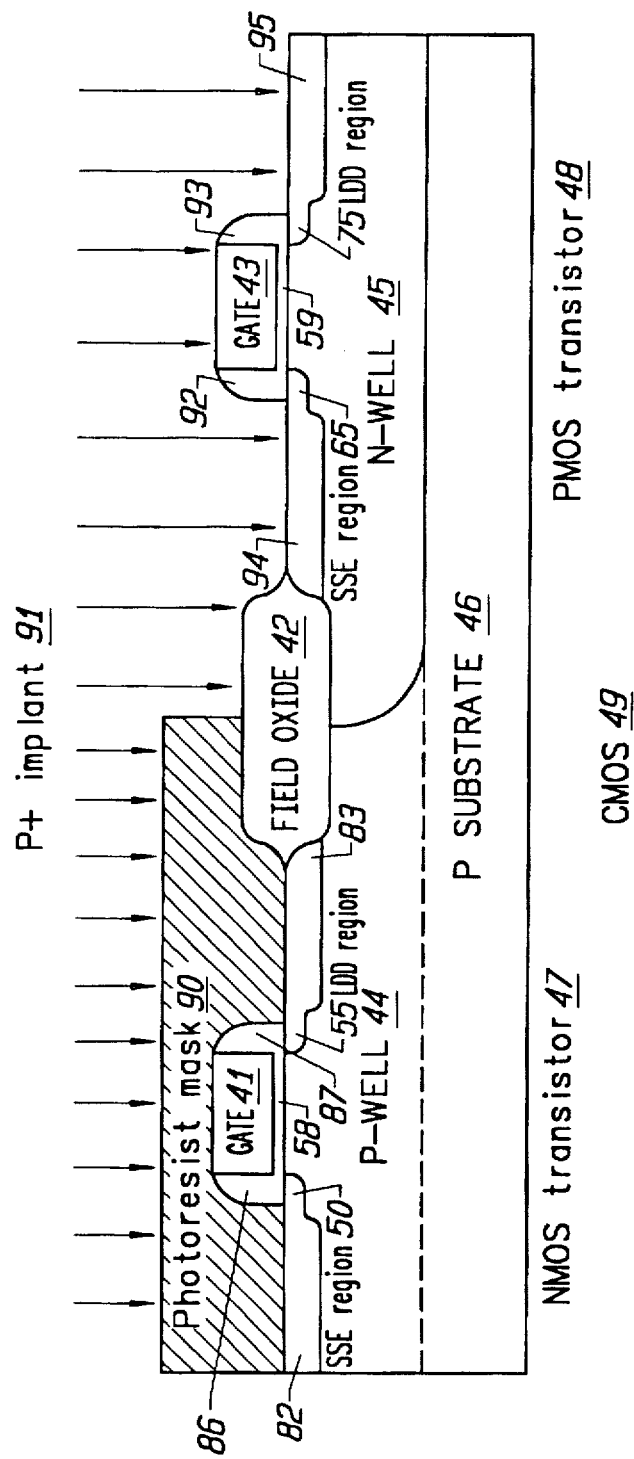

FIG. 7 illustrates the forming of source 94 and drain 95 in PMOS transistor 48. As discussed above, oxide spacers 92 and 93 are formed using conventional techniques before source 94 and drain 95 are formed in N-well 45. Mask 80, as illustrated in FIG. 6, is removed using conventional techniques. A mask 90, such as a photoresist mask, is formed over NMOS transistor 47 and a portion of field oxide 42. A heavy P-type implant is then used with a predetermined implant concentration and implant energy to form source 94 and drain 95. Oxide spacers 92 and 93 mask SLDD region 65 and LDD region 75 from the heavier dopant used to form source 94 and drain 95. In an embodiment, a heavy P-type implant can be formed using Boron in a concentration of approximately $1 \times 10^{15}$ atoms/cm$^2$ to $4 \times 10^{15}$ atoms/cm$^2$ at an implant energy level of approximately 50 KeV.

It should be noted that in an embodiment, the dopant concentrations used in forming SSE and LDD regions are about an order of magnitude less than heavy implant dopant concentrations used to form sources 82/94 and drains 83/95. This difference in concentration levels does not materially affect polygate doping levels.

In sum, a CMOS device 49 is formed using two masks to form SSE and LDD regions in respective transistors allowing for device designer flexibility in designing specific electrical characteristics. In particular, a CMOS device is provided with reduced resistance at or near an NMOS and PMOS transistor source, which enables higher $I_{DSAT}$ current and thus higher transistor switching speed. Because the LDD region can have a more graded drain-to-body diode (due to lower dose and/or higher implant energy), higher current can be achieved without increased hot carrier injection.

The foregoing description of the preferred embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A method for manufacturing a semiconductor device, comprising the steps of:

(a) forming a region in a substrate having a first conductive type;

(b) forming a gate on the first conductive type region;

(c) forming a first mask over a first portion of the first conductive type region;

(d) implanting a dopant having a lightly doped charge of a second conductive type into a second portion of the first conductive type region;

(e) forming a second mask on the second portion; and, (f) implanting a dopant having a lightly doped charge of a second conductive type into the first portion.

2. The method of claim 1, wherein the method further includes the steps of:

(a) forming a first and a second spacer adjacent the gate; and, (b) implanting a dopant having a heavily doped charge of a second conductive type into the first and second portions.

3. The method of claim 1, wherein the first conductive type is a P-type and the second conductive type is a N-type.

4. The method of claim 1, wherein the first conductive type is a N-type and the second conductive type is a P-type.

5. The method of claim 1, wherein a lightly doped charge concentration used in forming the first portion is greater than a lightly doped charge concentration used in forming the second portion.

6. The method of claim 2, wherein a lightly doped charge concentration is an order of magnitude less than a heavily doped charge concentration used in forming the first and second portion.

7. A method for manufacturing a complimentary metal oxide semiconductor("CMOS") device having a positively charged P-well region and a negatively charged N-well region, comprising the steps of:

(a) forming a first gate on the P-well region;

(b) forming a second gate on the N-well region;

(c) forming a first mask on the N-well region and a first portion of the P-well region;

(d) implanting a dopant having a light donor dose into a second portion of the P-well region;

(e) forming a second mask on the N-well region and the second portion of the P-well region;

(f) implanting a dopant having a light donor dose into the first portion of the P-well region;

(g) forming a third mask on the P-well region and a first portion of the N-well region;

(h) implanting a dopant having a light acceptor dose into a second portion of the N-well region;

(i) forming a fourth mask on the P-well region and the second portion of the N-well region;

(j) implanting a dopant having a light acceptor dose into the first portion of the N-well region;

(k) forming respective oxide spacers adjacent to the first and second gates;

(l) forming a fifth mask on the N-well region;

(m) implanting a dopant having a heavy donor dose into to the P-well region;

(n) forming a mask on the P-well region; and, (o) implanting a heavy doped acceptor dose into to the N-well region.

8. The method of claim 7, wherein the light acceptor dose implanted into the first region of the P-well region is different than the light acceptor dose implanted into the second region of the P-well region.

9. The method of claim 7, wherein the lightly doped charge in the first and second portion the N-well region are used to form a lightly doped drain ("LDD") and source side extension ("SSE").

10. The method of claim 7, wherein the gates are polysilicon gates.

11. The method of claim 7, wherein the masks are photoresist masks.

12. The method of claim 7, wherein the implanting of the heavy donor dose includes the step of forming a first source and first drain in the CMOS device.

13. The method of claim 12, wherein the implanting of the heavy acceptor dose includes the step of forming a second source and a second drain in the CMOS device.

14. The method of claim 7, wherein the light implant dose used in step (d) is about an order of magnitude less than the heavily doped implant concentration used in step (m).

\* \* \* \* \*